(12) United States Patent
Koinuma et al.

(10) Patent No.: US 7,259,409 B2
(45) Date of Patent: Aug. 21, 2007

(54) THIN FILM DEVICE AND ITS FABRICATION METHOD

(75) Inventors: Hideomi Koinuma, Tokyo (JP); Jeong-Hwan Song, Tokyo (JP); Toyohiro Chikyo, Tsukuba (JP); Young Zo Yoo, Tsukuba (JP); Parhat Ahmet, Tsukuba (JP); Yoshinori Konishi, Yokosuka (JP); Yoshiyuki Yonezawa, Yokosuka (JP)

(73) Assignee: Tokyo Institute of Technology, Tokyo (JP)

( * ) Notice: Subject to any disclaimer, the term of this patent is extended or adjusted under 35 U.S.C. 154(b) by 48 days.

(21) Appl. No.: 10/665,524

(22) Filed: Sep. 22, 2003

(65) Prior Publication Data

US 2004/0159854 A1 Aug. 19, 2004

(30) Foreign Application Priority Data

Sep. 20, 2002 (JP) ............................. 2002-276205

(51) Int. Cl.
*H01L 29/739* (2006.01)
*H01L 31/00* (2006.01)

(52) U.S. Cl. ............... 257/201; 257/200; 257/E29.094; 257/E29.296; 257/E21.603

(58) Field of Classification Search ..................... None
See application file for complete search history.

(56) References Cited

U.S. PATENT DOCUMENTS 5,403,673 A * 4/1995 Haga et al. ................. 428/688
6,400,070 B1 * 6/2002 Yamada et al. ............. 313/310
6,672,922 B2 * 1/2004 Shirakawa et al. ........... 445/24
6,888,156 B2 * 5/2005 Chikyow et al. ............. 257/12
2003/0006406 A1 1/2003 Chikyow et al.

FOREIGN PATENT DOCUMENTS

EP 1271626 * 1/2003 ................ 21/20

(Continued)

OTHER PUBLICATIONS

Y.Z. Yoo et al., "Fabrication of Epitaxial Wurtzite ZnS Film on Bare Si Substrate," Proceedings of the 2001 Spring JSAP annual meeting, 29a-K-7, 2001, p. 323.

(Continued)

*Primary Examiner*—Evan Pert
*Assistant Examiner*—Victor A. Mandala, Jr.
(74) *Attorney, Agent, or Firm*—Venable LLP; Michael A. Sartori; Marina V. Schneller

(57) ABSTRACT

A thin film device includes a metal sulfide layer formed on a single crystal silicon substrate by epitaxial growth; and a compound thin film with ionic bonding, which is formed on the metal sulfide layer by epitaxial growth. Alternatively, a thin film device includes a metal sulfide layer formed on a single crystal silicon substrate by epitaxial growth; and at least two compound thin films with ionic bonding, which are formed on the metal sulfide layer by epitaxial growth. For example, $(11\bar{2}0)$ surface AlN/MnS/Si (100) thin films formed by successively stacking a MnS layer (about 50 nm thick) and an AlN layer (about 1000 nm thick) on a single crystal Si (100) substrate, are used as a substrate, and a $(11\bar{2}0)$ surface GaN layer (about 100 nm thick) operating as a light emitting layer is formed on the substrate, thereby fabricating a thin film device.

3 Claims, 16 Drawing Sheets

FOREIGN PATENT DOCUMENTS

| | | | | |
|---|---|---|---|---|
| JP | 61-111137 | | 5/1986 | |
| JP | 62-181483 | * | 8/1987 | ............ 3/18 |
| JP | 362181483 | * | 8/1987 | ............ 3/18 |
| JP | 3-160735 A | | 7/1991 | |
| JP | 3-160736 A | | 7/1991 | |
| JP | 3-187189 A | | 8/1991 | |
| JP | 8-82612 A | | 3/1996 | |
| JP | 08-264900 | | 10/1996 | |
| JP | 2002-003297 | * | 1/2002 | ............ 29/16 |
| JP | 2002-003297 A | | 1/2002 | |
| JP | 2002-075871 | | 3/2002 | |
| JP | 2004-006562 | | 1/2004 | |

OTHER PUBLICATIONS

Yoshinori Konishi et al., "Preparation of Epitaxial Thin Films on Si Substrate With a ZnS Buffer Layer," Proceedings of the 2002 Spring JSAP annual meeting, 28p-YB-8, 2002, p. 621.

Y.Z. Zoo, et al., "ZnO/ZnS Heteroepitaxy on Si by Laser-MBE," Proceedings of the 2002 Spring JSAP annual meeting, 28p-ZN-2, 2002, p. 315.

Akito Kuramata et al., "Continuous-Wave Operation 1nGaN Laser Diodes on SiC Substrates," Oyobuturi, The Japan Society of Applied Physcis, Jul. 10, 1999, pp. 797-800, vol. 68, No. 7.

Seikoh Yoshida, "Electronic Devices Using GaN," Oyobuturi, The Japan Society of Applied Physics, Jul. 10, 1999, pp. 787-792, vol. 68, No. 7.

Von Robert Juza et al., "Solid Solution in Systems ZnS/MnS, ZnSe/MnSe and ZnTe/MnTe," Journal of Inorganic and General Chemistry, vol. 285, 1956, pp. 61-69.

A. Miyake et al.,"Luminescent properties of ZnO thin films grown epitaxially on Si substrate", Journal of Crystal Growth, 214/215, 2000, pp. 294-298.

May 16, 2003 Office Action for U.S. Appl. No. 10/179,006.

U.S. Appl. No. 10/179,006.

Oyo Buturi, vol. 68, p. 790 (1999).

*Applied Physics*, vol. 68, p. 798, (1999).

*Oxide Electronics Report II*, Japan Electronics and Information Technology Industries Association, pp. 135 to 141 (1997).

*Japanese Journal of Applied Physics*, vol. 39 (2000).

*Appl. Phys. Lett.* 69, 3266 (1996).

*National Technical Report*, vol. 33, No. 6, p. 687 (1987).

YAHOO! Search—Epitaxial.

* cited by examiner

● W-AlN (11$\bar{2}$0)
○ ZB-AlN (220)

THIN FILM DEVICE AND ITS FABRICATION METHOD

This application claims priority from Japanese Patent Application No. 2002-276205 filed Sep. 20, 2002, which is incorporated hereinto by reference.

BACKGROUND OF THE INVENTION

1. Field of the Invention

The present invention relates to a thin film device including a compound having ionic bonding (called "ionic crystal" from now on) and its fabrication method, and more particularly to a thin film device and its fabrication method preferably applicable to electronic devices utilizing an ionic crystal thin film as a functional film, such as a high brightness blue light emitting device (semiconductor laser), metal insulator semiconductor field effect transistor (MISFET), high electron mobility transistor (HEMT) and thin film capacitor.

2. Description of the Related Art

Nitride, oxide and sulfide each exhibit a variety of physical properties. Although they are valuable functional materials as polycrystalline, their single crystals can become more effective or exhibit new characteristics. When applying these materials to thin film devices, forming their single crystal thin films can implement high performance, high function devices unachievable by polycrystalline thin films.

For example, consider devices using nitride thin films such as a high brightness blue light emitting device using GaN thin films, a MISFET using AlN/GaN thin films and a HEMT using AlGaN/GaN thin films. Although a variety of such devices have been proposed and implemented, unless the nitride thin films consist of single crystal thin films without little lattice defects or grain boundary, their carrier mobility can be reduced, or the light emitting efficiency of their light emitting layers or their lifetime can be reduced.

As for the single crystal thin films, it is common that they are epitaxially grown using a single crystal substrate. For example, there have been reported that GaN-based single crystal thin films are formed on a single crystal sapphire substrate by an MOCVD (Metal Organic Chemical Vapor Deposition) method or by a gas source MBE method (Molecular Beam Epitaxial Method), or on a SiC substrate by a low pressure metal organic vapor phase epitaxy (see, Kiyoteru Yoshida "Electronic devices using GaN" pp. 787–792 and Kuramata et al., "Continuous-Wave Operation InGaN Laser Diodes On SiC Substrates," pp. 797–800, OYOBUTURI Vol. 68, No. 7, published by The Japan Society of Applied Physics, Jul. 10, 1999). As for the oxide-based single crystal thin films, their epitaxial thin films are formed on a substrate composed of single crystal strontium titanate ($SrTiO_3$:STO), single crystal lanthanum aluminate ($LaAlO_3$: LAO) or single crystal sapphire substrate by a sputtering or PLD method (Pulsed Laser Deposition).

However, since the sapphire substrate, SiC substrate, single crystal STO substrate and single crystal LAO substrate are expensive, it is preferable that the thin films be formed on a general purpose Si substrate. In addition, from the viewpoint of a merger with Si devices, it is preferable that the functional thin films be epitaxially grown on a Si substrate. However, it is difficult to epitaxially grow an ionic bonding thin film directly on a Si single crystal substrate. The reason for this is considered that since the silicon is a covalent crystal, a material with a lattice constant differ from that of Si by a few percent cannot grow coherently (pseudomorphically) on a substrate, thereby leaving lattice defects.

As a method of forming a thin film on a Si single crystal substrate, a method of inserting a buffer layer is known.

A commonly used method is to form a metal oxide of $CeO_2$, $Y_2O_3$, $ZrO_2$ and the like, which are more susceptible to oxidation than Si, thereby preventing non-crystalline (amorphous) $SiO_2$ from being generated. However, it is unavoidable that the Si surface undergoes oxidation, which offers a problem of degrading the film characteristic of the buffer layer formed on the $SiO_2$. In addition, a buffer layer using TiN or TaN also has a problem of forming $SiN_x$.

To cope with this, a method using a metal sulfide thin film as the buffer layer is proposed (see, Japanese Patent Application Laid-open No.2002-003297). According to the relevant document, the formation Gibbs' energy of forming the Si sulfide is rather small. Thus, when its lattice constant is close to that of Si, it is possible to epitaxially grow the sulfide without forming an amorphous layer on an interface between the buffer layer and Si. The Japanese Patent Application Laid-open No.2002-003297 discloses that the elements such as Al, Ba, Be, Ca, Ce, In, La, Li, Mg, Mn, Mo, Na, Sr, Ta and Zr have the formation Gibbs' energy greater than Si in forming the sulfide, and that using a sulfide composed of one of them or a combination of them can suppress the Si interface reaction, and proposes an oxide thin film device and its fabrication method using the metal sulfide layer as the buffer layer.

Furthermore, CdS and ZnS also have the formation Gibbs' energy greater than that of Si in forming the sulfide.

However, a thin film device including epitaxial thin films for a laser diode or LED formed on a Si substrate, and its fabrication method have not been implemented.

SUMMARY OF THE INVENTION

An object of the present invention to provide a thin film device having a metal sulfide epitaxial thin film formed on a Si substrate when fabricating a compound thin film device with ionic bonding on a Si single crystal substrate, and a fabrication method of the thin film device having the epitaxial thin film formed. As a result of a new research, the applicants have found that it is possible to epitaxially grow a sulfide thin film other than ZnS on a Si substrate, and to epitaxially grow on its surface an ionic crystal other than an oxide.

According to a first aspect of the present invention, there is provided a thin film device comprising: a metal sulfide layer formed on a single crystal silicon substrate by epitaxial growth; and a compound thin film with ionic bonding, which is formed on the metal sulfide layer by epitaxial growth.

According to a second aspect of the present invention, there is provided a thin film device comprising: a metal sulfide layer formed on a single crystal silicon substrate by epitaxial growth; and at least two compound thin films with ionic bonding, which are formed on the metal sulfide layer by epitaxial growth.

According to a third aspect of the present invention, the metal sulfide layer in the first or second aspect of the present invention may be composed of one of a manganese sulfide (MnS), magnesium sulfide (MgS), and calcium sulfide (CaS).

According to a fourth aspect of the present invention, the metal sulfide layer in the first or second aspect of the present invention may be composed of a material whose chemical formula is given by $Zn(1-x)M_xS_y$, in which part of zinc of zinc sulfide (ZnS) is substituted by another metal (M), where x and y are values between 0 and 1.

According to a fifth aspect of the present invention, the metal sulfide layer in the fourth aspect of the present invention may be composed of zinc manganese sulfide ((Zn, Mn)S).

According to a sixth aspect of the present invention, the metal sulfide layer in the first or second aspect of the present invention may be composed of a material whose chemical formula is given by $Zn(1-x)(M, N, \ldots)_x S_y$, in which part of zinc of zinc sulfide (ZnS) is substituted by other metals (M, N, ...), where x and y are values between 0 and 1.

According to a seventh aspect of the present invention, the thin film device in the first or second aspect of the present invention may further comprise a platinum group layer formed between the metal sulfide layer and the compound thin film by epitaxial growth.

According to an eighth aspect of the present invention, a metal of the platinum group layer in the seventh aspect of the present invention may be one of rhodium, iridium, palladium and platinum or an alloy of them, and the platinum group layer may be composed of a single layer or multi-layer thin film thereof.

According to a ninth aspect of the present invention, the compound thin film in any one of first to eighth aspect of the present invention may be composed of a metal nitride thin film.

According to a tenth aspect of the present invention, the compound thin film in any one of first to eighth aspect of the present invention may be composed of a metal oxide thin film.

According to an 11th aspect of the present invention, the compound thin film in any one of first to eighth aspect of the present invention may be composed of a metal sulfide thin film.

According to a 12th aspect of the present invention, there is provided a thin film device comprising: a manganese sulfide (MnS) layer formed on a single crystal silicon (100) substrate by epitaxial growth; and an aluminum nitride (AlN) layer formed on the manganese sulfide layer by epitaxial growth, the aluminum nitride (AlN) layer having a $(11\bar{2}0)$ surface as its top surface.

According to a 13th aspect of the present invention, the thin film device in the 12th aspect of the present invention may further comprise a compound thin film with ionic bonding, which has a $(11\bar{2}0)$ surface formed by epitaxial growth as its top surface, and is formed on the aluminum nitride (AlN) layer having the $(11\bar{2}0)$ surface as its top surface, or via another intermediate layer.

According to a 14th aspect of the present invention, the compound thin film in the 13th aspect of the present invention may be composed of a gallium nitride (GaN) thin film having a $(11\bar{2}0)$ surface as its top surface.

According to a 15th aspect of the present invention, there is provided a fabrication method of a thin film device comprising the steps of: epitaxially growing metal sulfide on a single crystal silicon substrate by feeding molecular metal sulfide on the single crystal silicon substrate under a reduced pressure; and epitaxially growing a compound thin film with ionic bonding on the metal sulfide.

According to a 16th aspect of the present invention, there is provided a fabrication method of a thin film device comprising the steps of: epitaxially growing metal sulfide on a single crystal silicon substrate by feeding molecular metal sulfide on the single crystal silicon substrate under a reduced pressure; and epitaxially growing at least two compound thin films with ionic bonding sequentially on the metal sulfide.

According to a 17th aspect of the present invention, there is provided a fabrication method of a thin film device comprising the steps of: epitaxially growing a metal sulfide layer on a single crystal silicon substrate by feeding molecular manganese sulfide on the single crystal silicon substrate under a reduced pressure; epitaxially growing an aluminum nitride (AlN) layer having a $(11\bar{2}0)$ surface as its top surface; and forming on the aluminum nitride layer a gallium nitride (GaN) thin film having a $(11\bar{2}0)$ surface as its top surface.

According to an 18th aspect of the present invention, there is provided a fabrication method of a thin film device comprising the step of sequentially stacking a metal sulfide layer epitaxially grown on a single crystal silicon substrate, and at least two compound thin films with ionic bonding, which are epitaxially grown on the metal sulfide layer.

According to a 19th aspect of the present invention, there is provided a fabrication method of a thin film device comprising the steps of: forming a metal sulfide layer on a single crystal silicon substrate by epitaxial growth; forming a platinum group layer on the metal sulfide layer by epitaxial growth; and forming a compound thin film ionic bonding on the platinum group layer by epitaxial growth.

According to a 20th aspect of the present invention, the compound thin film in any one of 15th, 16th, 18th and 19th aspects of the present invention may be composed of a metal nitride thin film.

According to a 21st aspect of the present invention, the compound thin film in any one of 15th, 16th, 18th and 19th aspects of the present invention may be composed of a metal oxide thin film.

According to a 22nd aspect of the present invention, the compound thin film in any one of 15th, 16th, 18th and 19th aspects of the present invention may be composed of a metal sulfide thin film.

The above and other objects, effects, features and advantages of the present invention will become more apparent from the following description of embodiments thereof taken in conjunction with the accompanying drawings.

DETAILED DESCRIPTION OF PREFERRED EMBODIMENTS

The invention will now be described with reference to the accompanying drawings.

Figure 1:
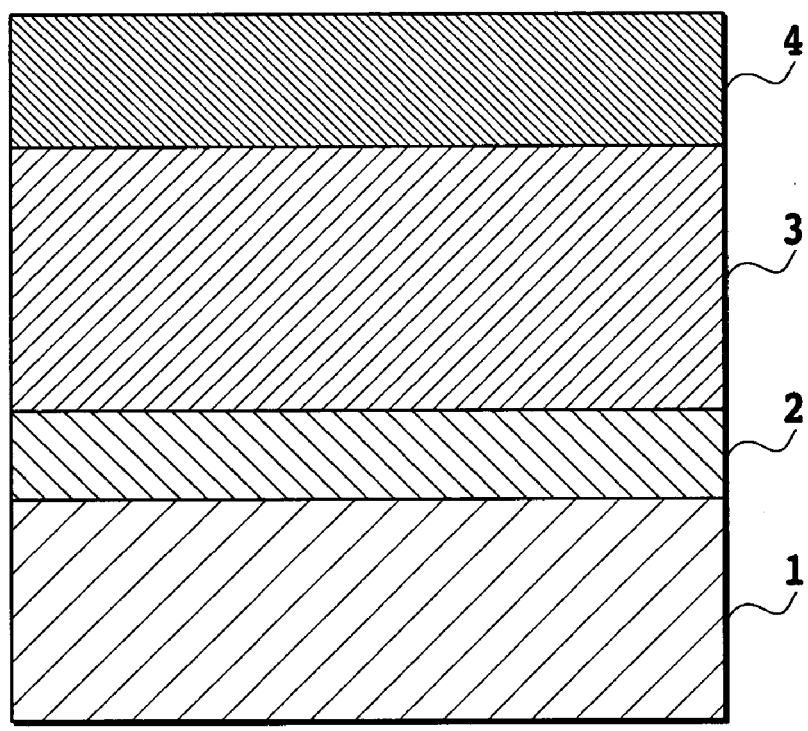
FIG. 1 is a cross-sectional view showing a structure of an AlN substrate and GaN thin films formed thereon to construct a GaN light emitting device in accordance with the present invention.

FIG. 1 is a cross-sectional view showing a structure of an AlN substrate and GaN thin films formed thereon, which constitute a GaN light emitting device in accordance with the present invention. As for an existing GaN-based light emitting device grown on a sapphire (0001) surface, the Stark effect occurs because of internal electric field due to piezo-electric effect, thereby offering a problem of an adverse effect on its light emitting characteristics. To solve the problem, one of conventional techniques grows a GaN (११$\bar{2}$0) surface on the R surface of the sapphire of the sapphire substrate, and another of them grows a cubic GaN on a SiC/Si (100) surface. In contrast, the present embodiment employs a Si (100) surface, a commonly used substrate, and forms a Si (100) substrate 1 with an AlN (11$\bar{2}$0) surface capable of utilizing a thermodynamically stable GaN (11$\bar{2}$0) surface. Utilizing the AlN substrate in accordance with the present invention makes it possible to form the GaN (11$\bar{2}$0) surface inexpensively which is free from the adverse effect of the Stark effect on the light emitting characteristics, thereby being able to form the GaN light emitting device thereon.

Such GaN thin films are formed in the following process. Before describing the formation of the GaN (11$\bar{2}$0) surface thin film, the formation of a MnS buffer layer 2 on the Si substrate 1 will be described. A single crystal Si (100) substrate and single crystal Si (111) substrate had their native oxides removed by HF (Hydrogen Fluoride), followed by being washed with water, placed in a deposition chamber, and drawn to vacuum for about ten minutes. Then, the MnS buffer layer 2 was formed to a thickness of 20 nm by the PLD method at a substrate temperature of 700° C. in the vacuum of about $1 \times 10^{-6}$ Torr.

Figure 2A:
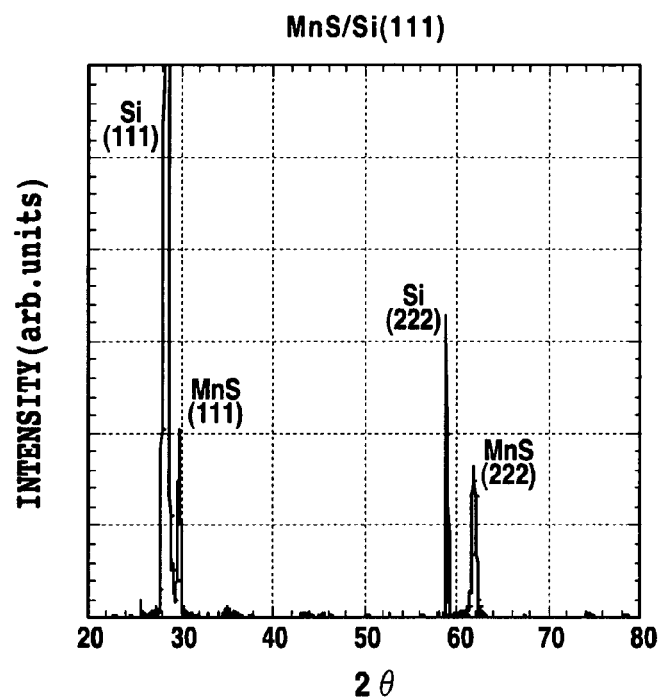
FIG. 2A is a graph illustrating characteristics of XRD (X-ray diffraction) measurement results of MnS/Si (111) thin films.
Figure 2B:
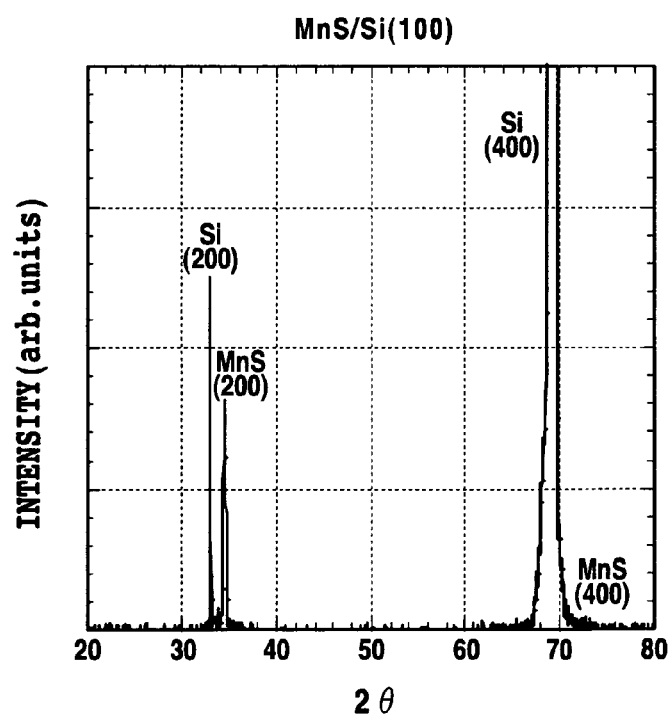
FIG. 2B is a graph illustrating characteristics of XRD measurement results of MnS/Si (100) thin films.

FIGS. 2A and 2B illustrate XRD measurement results of the MnS thin film. The MnS has a cubic NaCl structure with a lattice constant of 5.209 Å. The MnS has (111) orientation as illustrated in FIG. 2A when it is formed on the Si (111) substrate, and (100) orientation as illustrated in FIG. 2B when it is formed on the Si (100) substrate. Accordingly, as in the case of forming an ionic bonding epitaxial thin film on a Si substrate using ZnS as a buffer layer, using MnS as the buffer layer will make it possible to epitaxially grow an ionic crystal thin film with a cubic structure on the Si (100) substrate, and a hexagonal ionic crystal thin film on the Si (111) substrate. It is also preferable to form on the MnS thin film 2 or ZnS layer, a platinum group layer formed by the epitaxial growth, and to form on the platinum group layer, a compound thin film with ionic bonding formed by the epitaxial growth. One of rhodium, iridium, palladium, platinum or their alloys can be used to form a single layer film or multi-layer thin film. It is also preferable to sequentially stack two or more compound thin films with ionic bonding.

An AlN thin film 3 was formed on the MnS/Si thin film at a substrate temperature of 700° C. in a nitrogen atmosphere of $5 \times 10^{-5}$ Torr.

Figure 3:
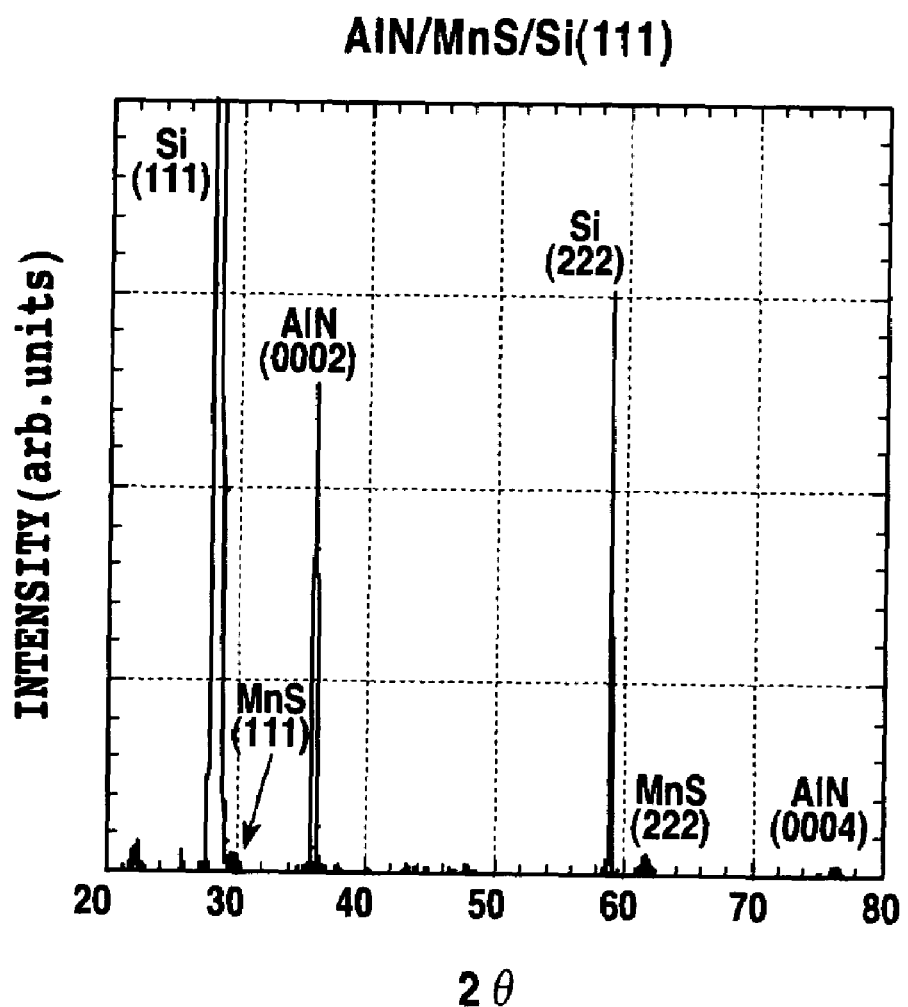
FIG. 3 is a graph illustrating characteristics of XRD measurement results of AlN/MnS/Si (111) thin films.

FIG. 3 illustrates XRD measurement results when the Si (111) substrate is used. An AlN thin film (W—AlN) of a wurtzite structure is grown with c axis orientation on the Si (111) substrate, thereby forming a c surface.

Figure 4A:
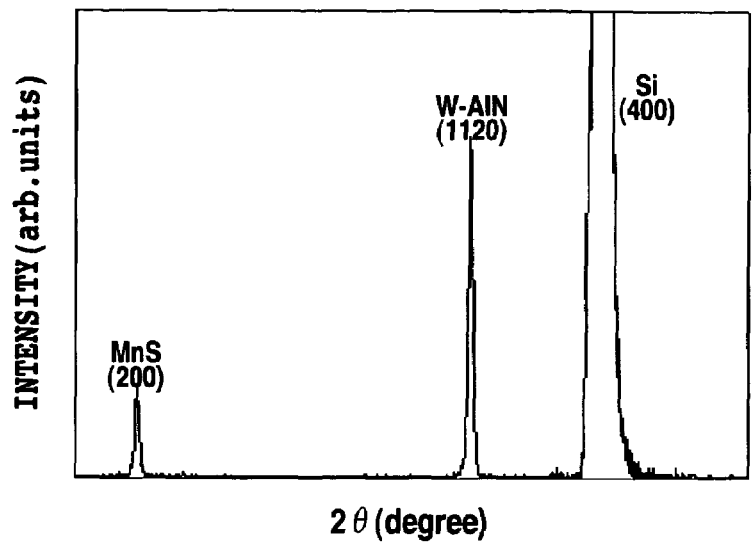
FIGS. 4A and 4B are graphs illustrating characteristics of XRD measurement results of AlN/Si (100) thin films.
Figure 4B:
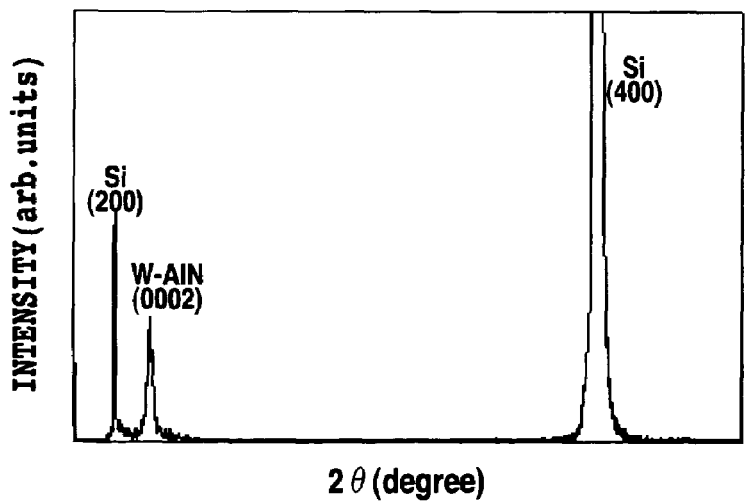

An AlN thin film was formed on the MnS/Si (100) thin film in the same conditions as those of the AlN thin film of FIG. 3. FIG. 4A illustrates XRD measurement results. The AlN thin film of the wurtzite structure with the (11$\bar{2}$0) surface orientation was grown on the Si (100) substrate. This plane is perpendicular to the c surface. FIG. 4B illustrates, for comparison purposes, XRD measurement results of an AlN thin film which was directly formed on a Si (100) substrate without forming the MnS buffer layer. Without the MnS buffer layer, the AlN thin film (W—AlN) of the wurtzite structure is grown with the c axis orientation. Therefore we found it effective to interpose the MnS buffer layer to form the (11$\bar{2}$0) surface of the AlN thin film on the Si (100) substrate.

Figure 5A:
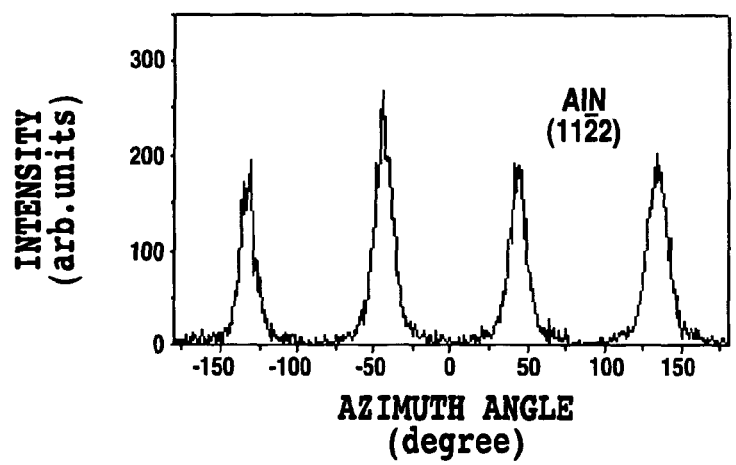
FIGS. 5A, 5B and 5C are graphs illustrating characteristics of XRD measurement results of AlN/MnS/Si (100) thin films.
Figure 5B:
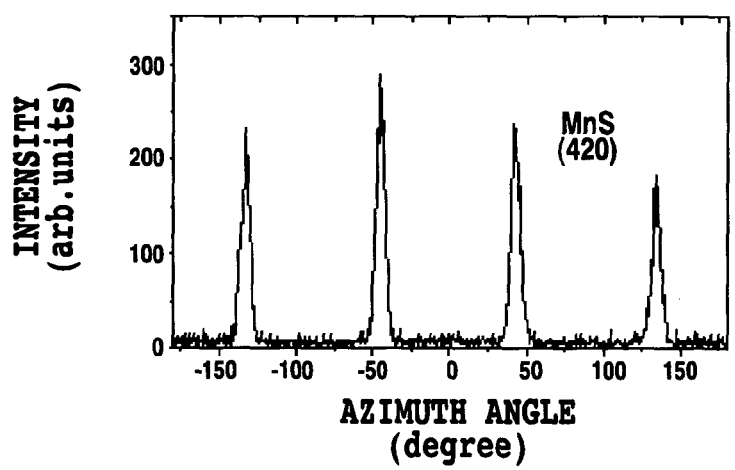
Figure 5C:
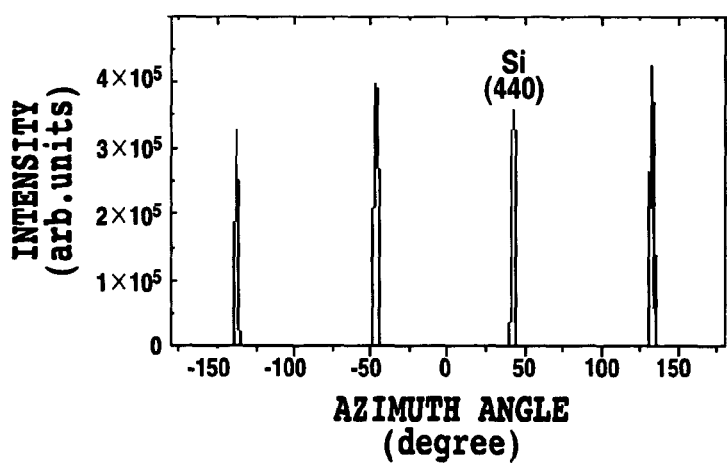

FIGS. 5A–5C illustrate XRD Phi scan measurement results of the AlN/MnS/Si (100) thin films. It is seen that the cubic MnS is epitaxially grown on the Si (100) substrate, and AlN thin film formed thereon is also epitaxially grown four times symmetrically.

It is seen from the RHEED (reflection high-energy electron diffraction) observation that the AlN thin film formed on the MnS/Si (100) thin film by the present fabrication method has a wurtzite structure rather than a sphalerite structure. The observation results are shown in FIGS. 6A and 6B and FIGS. 7A and 7B.

Figure 6A:
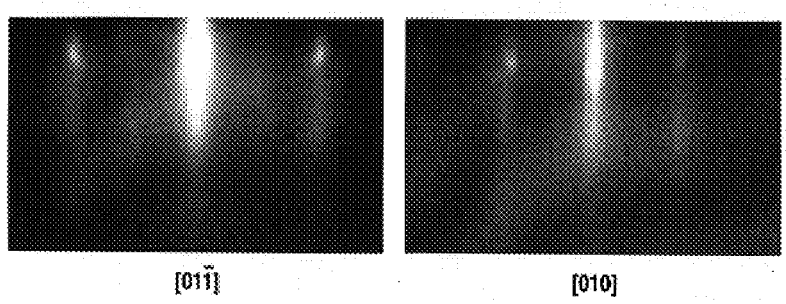
FIG. 6A is a view illustrating RHEED (reflection high electron energy diffraction) observation results of MnS/Si (100) thin films.
Figure 6B:
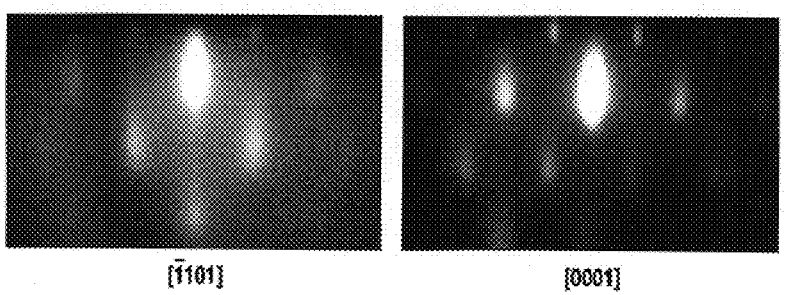
FIG. 6B is a view illustrating RHEED observation results of AlN/MnS/Si (100) thin films.

FIGS. 6A and 6B show patterns when an electron beam is launched into the Si[01$\bar{1}$] and Si[010] directions. FIG. 6A illustrates RHEED observation results of the MnS/Si (100) thin films. They exhibit a streak pattern, and it is seen from the spacing between the acceleration voltage (25 kV) of the incident electron beam and the streak that the lattice constant of MnS is about 5.2 Å, which nearly equal to the value 5.209 Å (JUZA et al., "Solid Solution in Systems ZnS/MnS, ZnSe/MnSe and ZnTe/MnTe," Journal of Inorganic and General Chemistry, Vol. 285, pp. 61–69, 1956). FIG. 6B illustrates the RHEED observation results of the AlN/MnS/ Si (100) thin films in the [$\bar{1}$100] direction and [0001] direction of the AlN thin film, respectively.

Figures 7A, 7B:
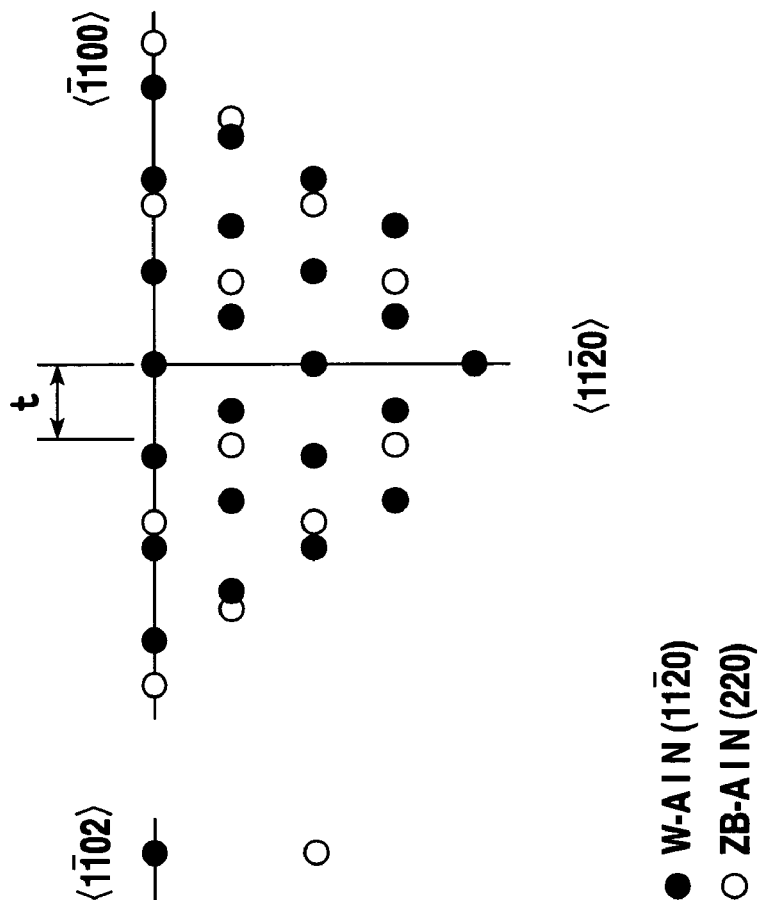
FIG. 7A is a diagram illustrating simulation results of a RHEED pattern of a W—AlN $(11\bar{2}0)$ surface.
FIG. 7B is a diagram illustrating simulation results of a RHEED pattern of an AlN (220) surface with a sphalerite (Wurtzite) structure.

FIG. 7A shows simulation results of the RHEED pattern of the W—AlN (11$\bar{2}$0) surface; and FIG. 7B shows simulation results of the RHEED pattern of the AlN (220) surface with the sphalerite (Zinc blende: ZB) structure and Wurtzite structure. The pattern analysis shows that the AlN thin film has a wurtzite structure. The orientation relationships correspond to the [1$\bar{1}$00] direction and [0001] direction of the AlN thin film along the Si[01$\bar{1}$] direction and Si[010] direction, respectively.

Figure 8:
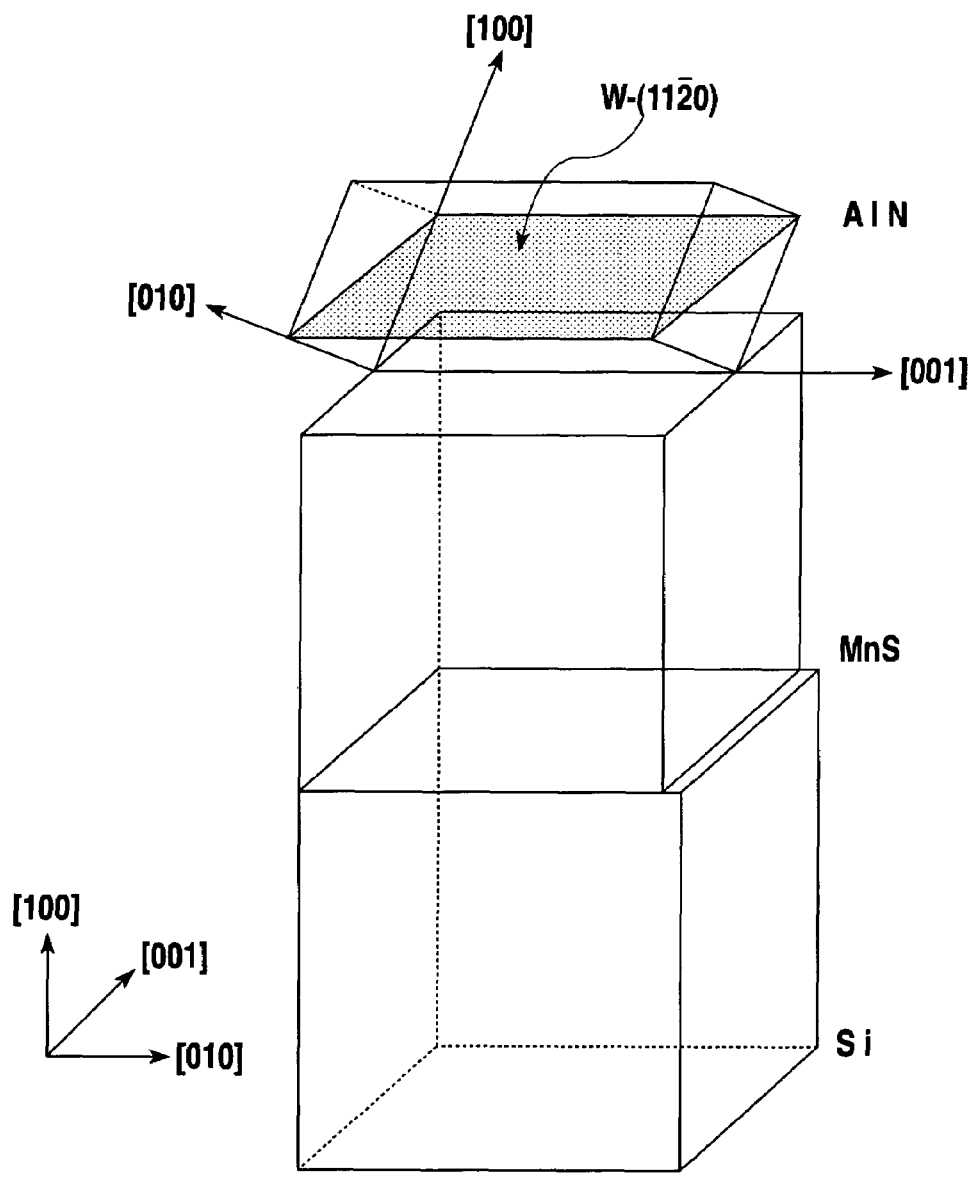
FIG. 8 is a schematic diagram showing crystal growth orientation relationships of AlN/MnS/Si (100) thin films.

FIG. 8 is a schematic diagram showing crystal growth orientation relationships of the AlN/MnS/Si (100) thin films. The orientation relationships of the thin film growth are AlN [0001] ∥ MnS [010] ∥ Si [010] and AlN [1$\bar{1}$00] ∥ MnS [001] ∥ Si [0011], and plane orientation relationships are AlN (11$\bar{2}$0) ∥ MnS (100) ∥ (100).

It is possible to form the (11$\bar{2}$0) surface GaN thin film by utilizing as the substrate the (11$\bar{2}$0) surface AlN/MnS/Si (100) thin films which are obtained by starting from the commonly used Si substrate, and hence to fabricate the stacked structure with the cross-sectional structure as shown in FIG. 1. In FIG. 1, the reference numeral 1 designates the single crystal Si (100) substrate; 2 designates the MnS layer (of about 50 nm thickness) formed on the single crystal substrate 1; 3 designates an AlN layer (of about 1000 nm thickness) formed on the MnS layer 2, and 4 designates a GaN layer (of about 100 nm thickness) formed on the AlN layer and functioning as a light emitting layer.

Such a stacked structure can be formed as described below. The single crystal Si (100) substrate had its native oxide removed by HF (Hydrogen Fluoride), followed by being washed with water, placed in a deposition chamber, and drawn to vacuum for about ten minutes. Then, the MnS buffer layer 2 was formed to a thickness of about 50 nm by the PLD method at a substrate temperature of 700° C. in the vacuum of about $1 \times 10^{-6}$ Torr. The thin film was cooled at room temperature, and the AlN layer 3 was formed to a thickness of about 1000 nm at a substrate temperature of 700° C. in a nitrogen atmosphere of about $5 \times 10^{-5}$ Torr in another PLD system. Then, the GaN layer 4 was formed to about 100 nm at the substrate temperature of 1000° C. by the MOCVD method.

Figure 9:
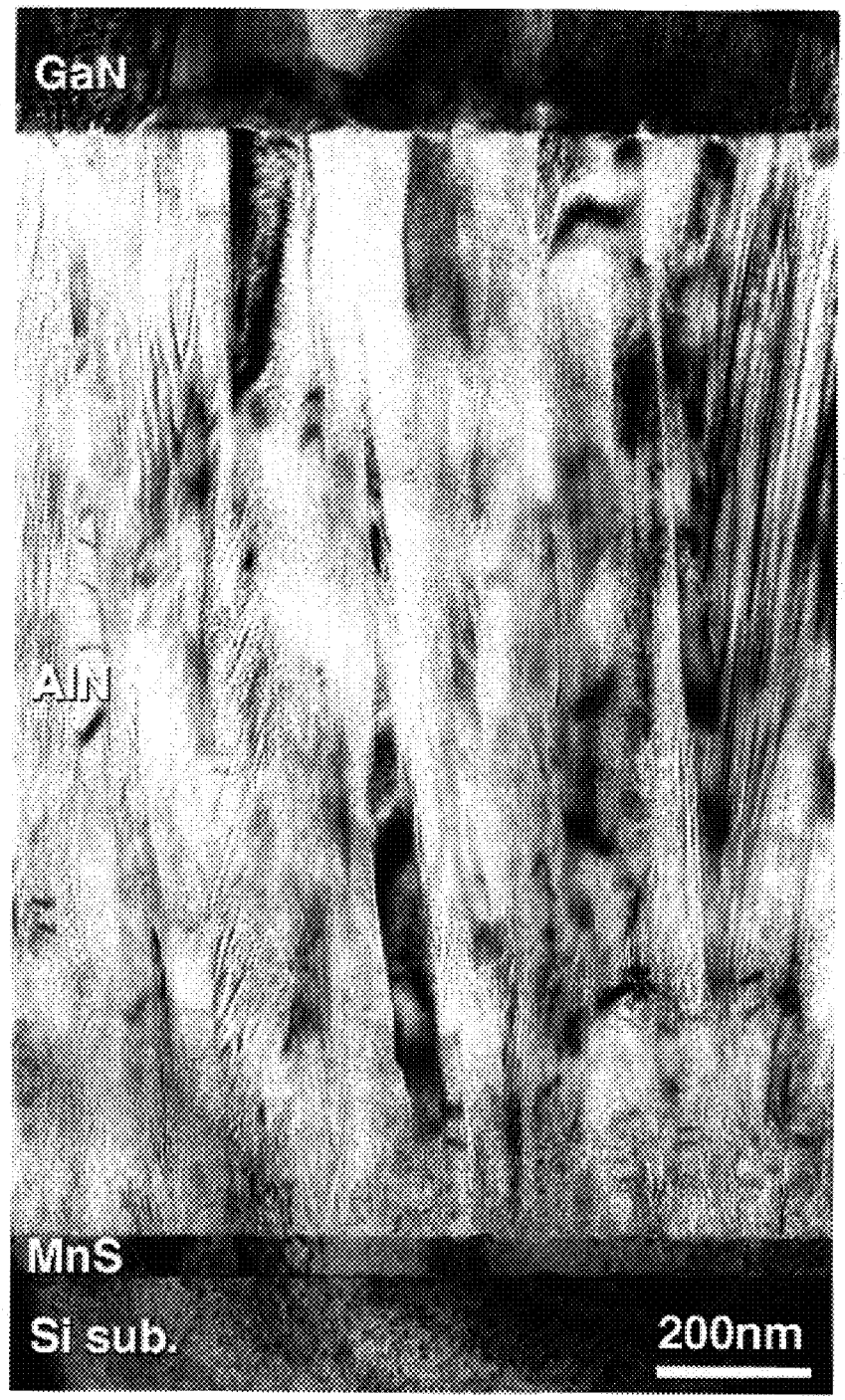
FIG. 9 is a view showing a cross-sectional TEM (Transmission Electron Microscope) image of GaN/AlN/MnS/Si (100) thin films.
Figure 10:
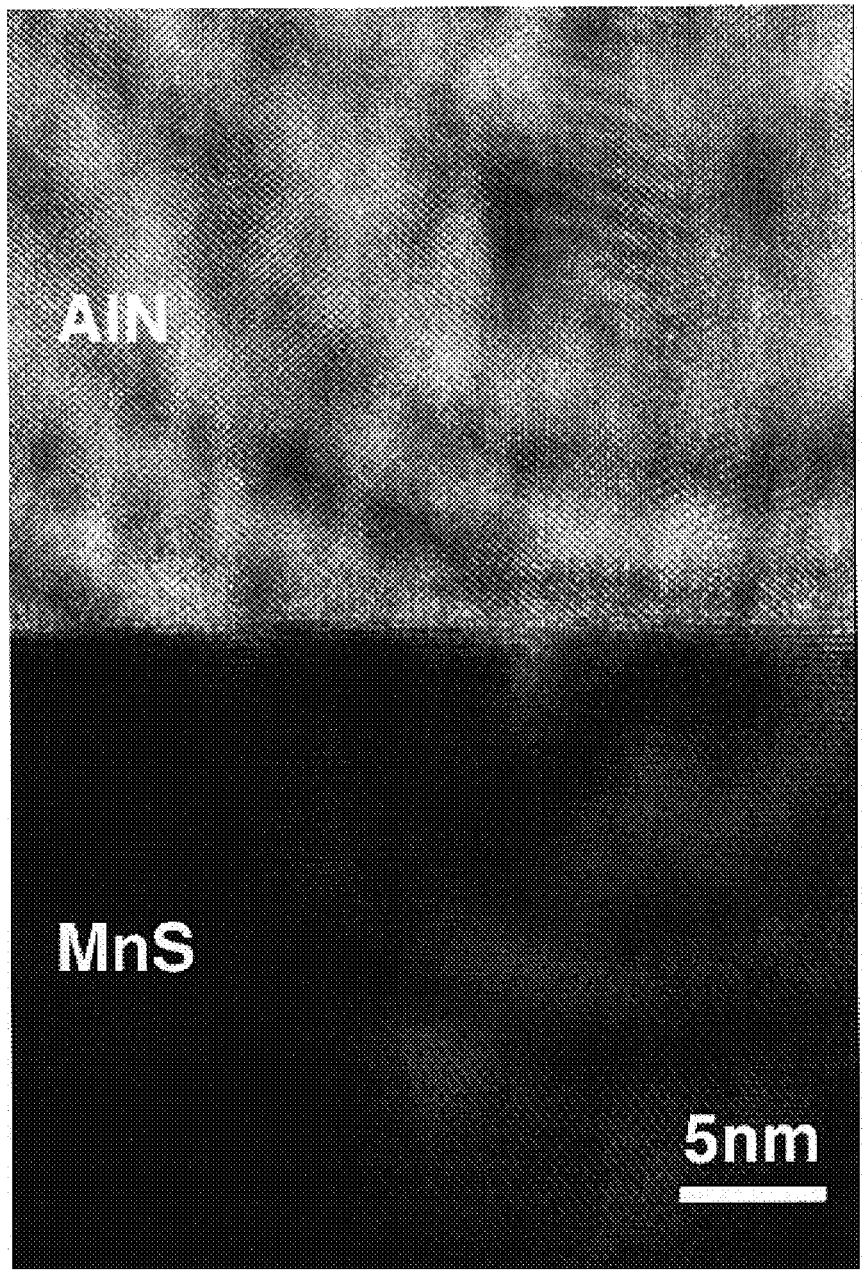
FIG. 10 is a view showing a cross-sectional TEM image of an AlN/MnS interface.
Figure 11:
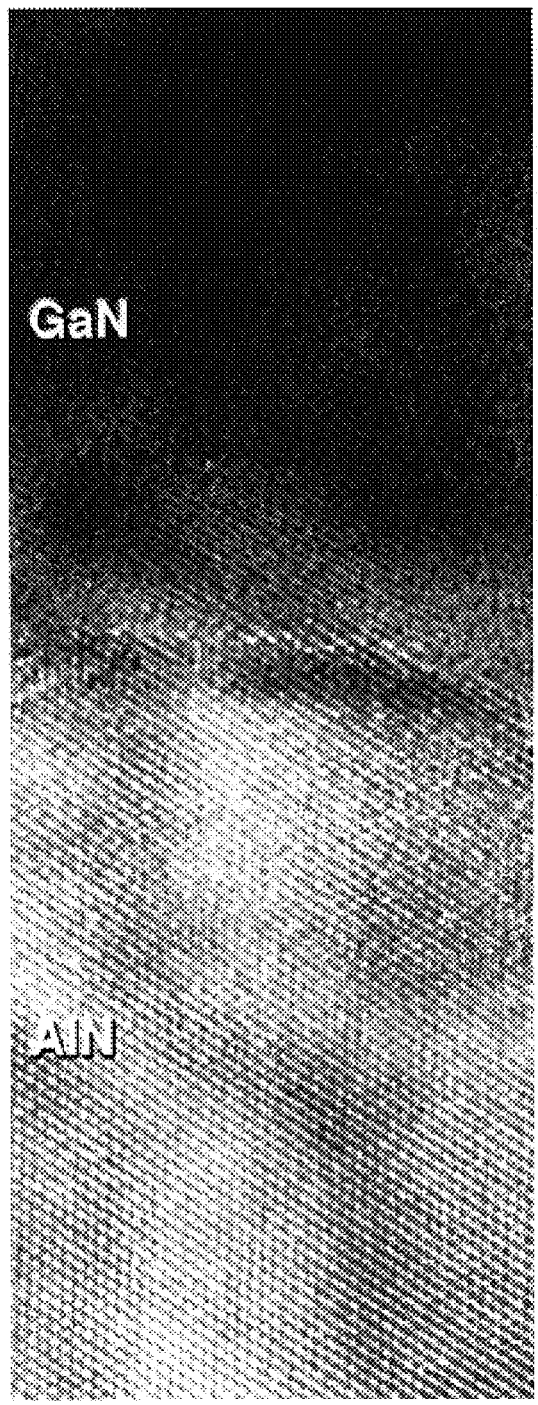
FIG. 11 is a view showing a cross-sectional TEM image of a GaN/AlN interface.

FIGS. 9–11 each show a cross-sectional TEM image: FIG. 9 shows that of the entire cross-section of the GaN/AlN/MnS/Si (100) thin films; FIG. 10 shows that of the AlN/MnS interface; and FIG. 11 shows that of the GaN/AlN interface. These figures show little interface reaction layer, presenting clear lattice images. As a result of the XRD measurement, it was found that the GaN thin film with a major orientation (11$\bar{2}$0) was formed.

Figure 12:
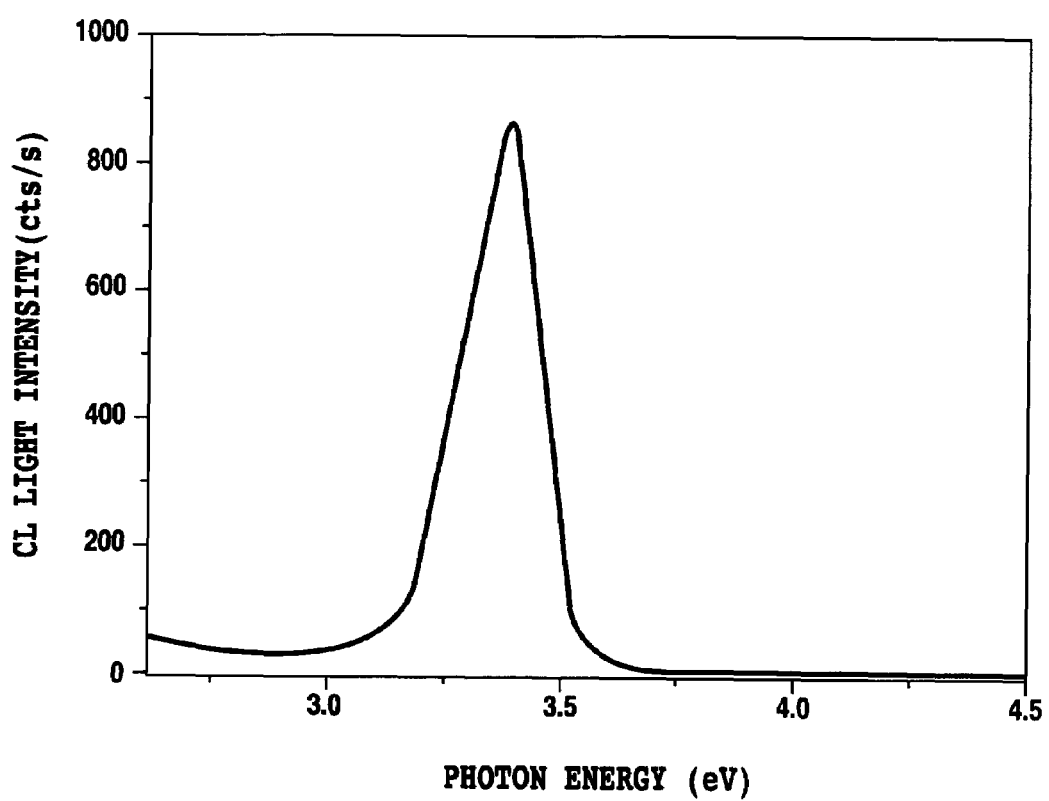
FIG. 12 is a graph illustrating a cathode luminescence light emitting spectrum of GaN/AlN/MnS/Si (100) thin films at room temperature.

FIG. 12 illustrates a cathode luminescence (CL) light emitting spectrum of the GaN/AlN/MnS/Si (100) thin films at room temperature (295K). The light emitting of about 3.3 eV ultraviolet light was observed.

Figure 13:
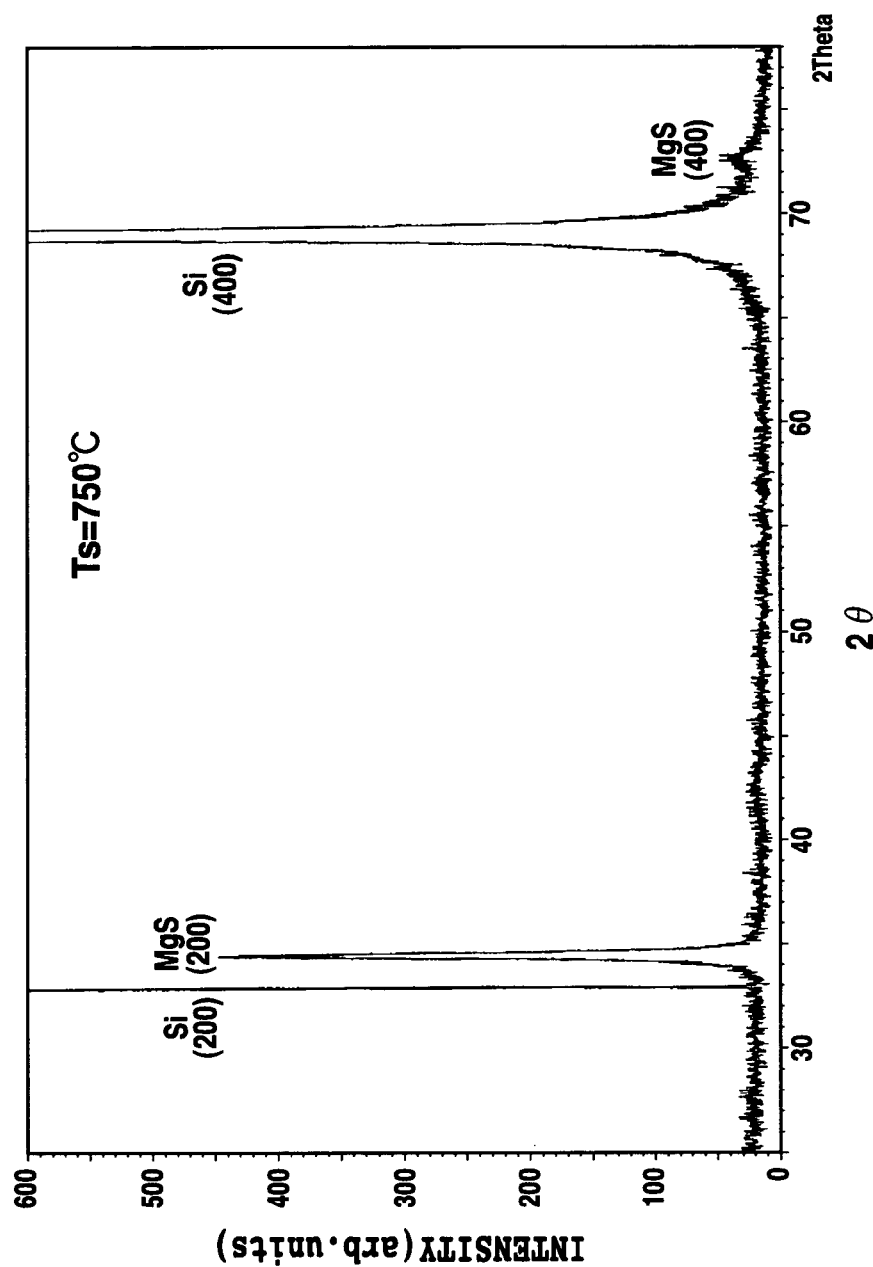
FIG. 13 is a graph illustrating characteristics of XRD measurement results (2θ-ω) of MgS/Si (100) thin films.
Figure 14:
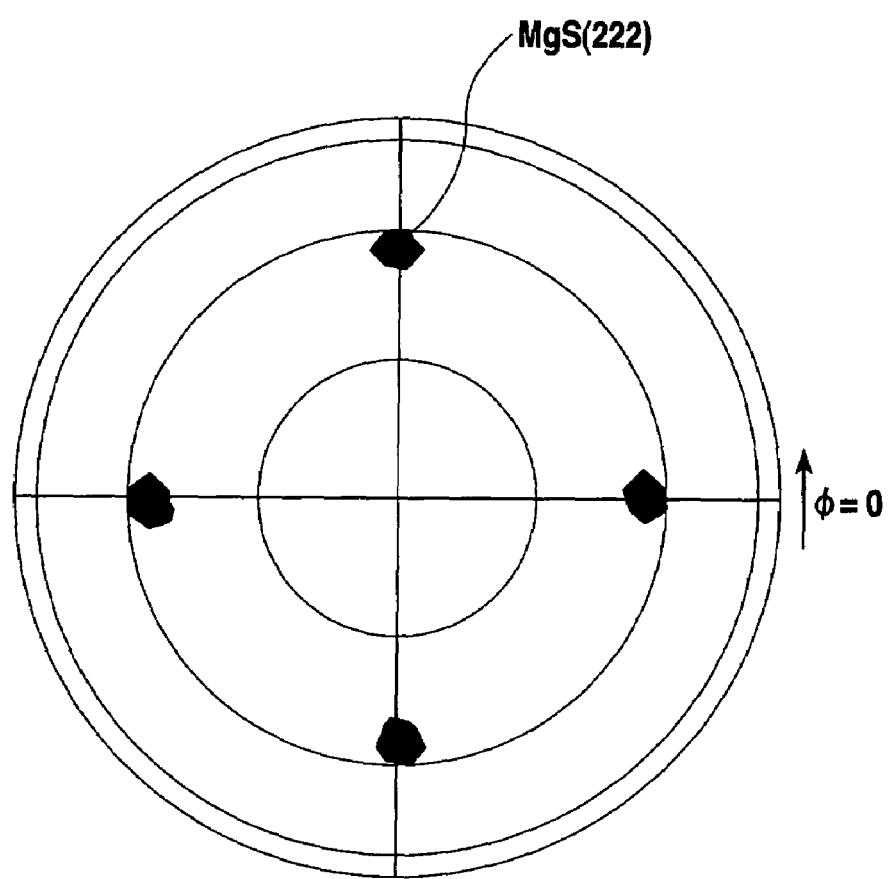
FIG. 14 is a diagram illustrating characteristics of XRD measurement results (pole-figure of MgS (222) peaks) of MgS/Si (100) thin films.
Figure 15:
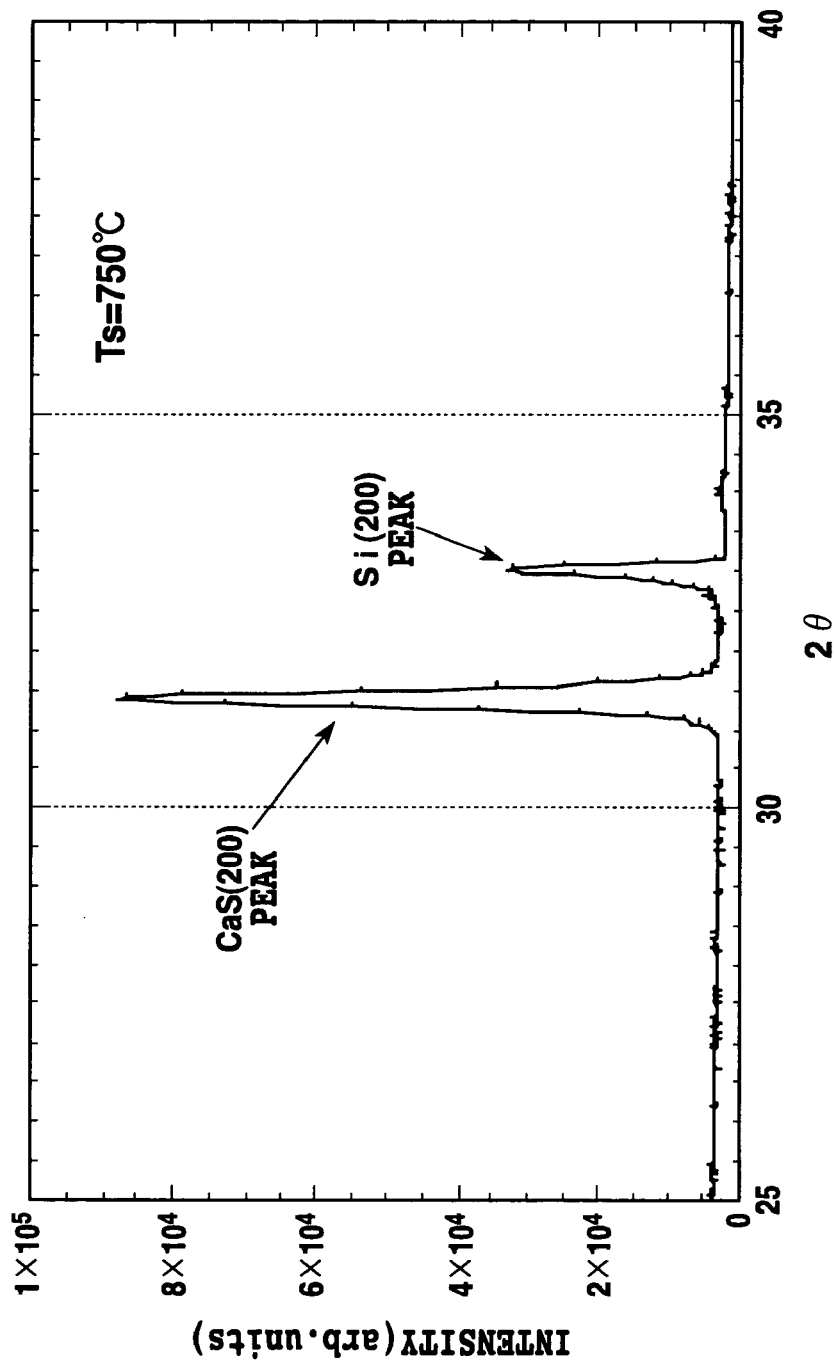
FIG. 15 is a graph illustrating characteristics of XRD measurement results (2θ-ω) of MgS/Si (100) thin films.

Sulfides other than MnS, which are epitaxially grown on the Si substrate, will be enumerated. FIGS. 13 and 14 illustrate 2θ-ω measurement results using MgS (FIG. 13) and pole-figure measurement results of MgS (222) peaks (FIG. 14). FIG. 15 illustrates 2θ-ω) measurement results using CaS. Both the MgS and CaS thin films are epitaxially grown on the Si (100) substrate.

Figure 16A:
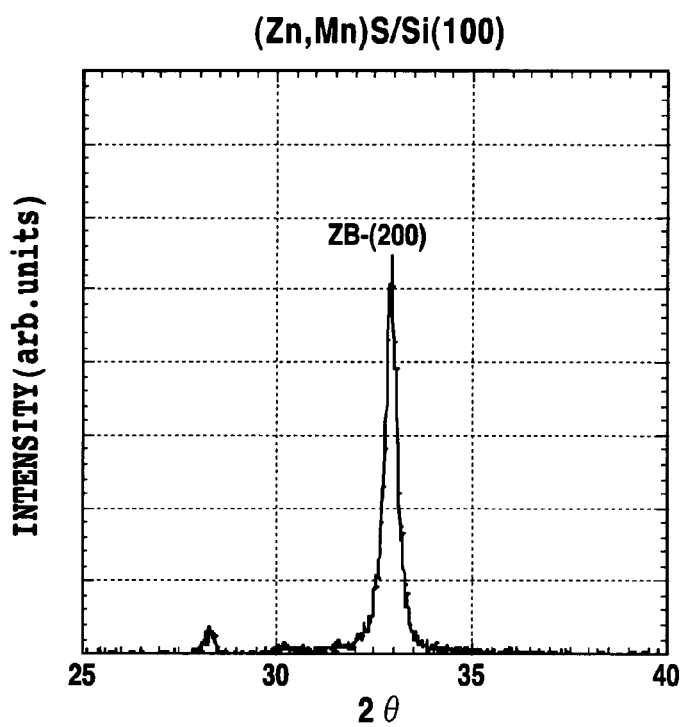
FIG. 16A is a graph illustrating characteristics of XRD measurement results of (Zn, Mn)S films (Mn is 5%) formed on a Si (100) substrate using a PLD method.
Figure 16B:
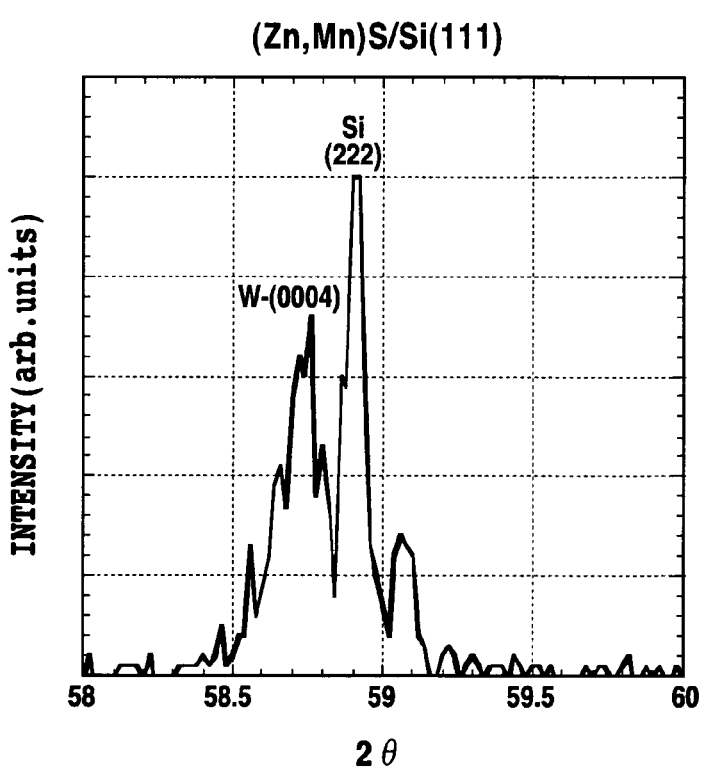
FIG. 16B is a graph illustrating characteristics of XRD measurement results of (Zn, Mn)S films (Mn is 5%) formed on a Si (111) substrate using a PLD method.

FIGS. 16A and 16B illustrate XRD measurement results when the (Zn, Mn)S (Mn is 5%) is formed on the Si substrate by the PLD method. It has (100) orientation as illustrated in FIG. 16A when it is formed on the Si (100) substrate, and (111) orientation as illustrated in FIG. 16B when it is formed on the Si (111) substrate. Accordingly, as in the case of forming an ionic bonding epitaxial thin film on a Si substrate using ZnS as a buffer layer, using (Zn, Mn) S as the buffer layer will make it possible to epitaxially grow an ionic crystal thin film with a cubic structure on the Si (100) substrate, and a hexagonal ionic crystal thin film on the Si (111) substrate.

Incidentally, since the lattice constant of ZnS is smaller than that of a Si substrate by only 0.5% at room temperature, it is suitable for epitaxial growth. Using a composite metal sulfide such as (Zn, Mn)S, in which part of Zn is replaced by another metal, can vary the lattice constant of ZnS slightly, thereby being able to create a composition with better lattice matching with Si. In this case, it is preferable to use materials represented by chemical formula $Zn(1-x)M_xS_y$ (where x and y are values between 0 and 1), in which part of zinc of the zinc sulfide (ZnS) is replaced by a particular metal (M). It is also preferable to use materials represented by chemical formula $Zn(1-x)M_xS_y$ (where x and y are values between 0 and 1), in which part of zinc of the zinc sulfide (ZnS) is replaced by a particular metal (M). The thermal expansion coefficient of Si is about $4.6 \times 10^{-6}$/K, which is slightly less than that of ZnS of about $6.7 \times 10^{-6}$/K. Thus, it will be possible to control the opposite film formation temperature by the composition of the sulfide buffer layer.

Furthermore, the following growing methods are also preferable. A first method epitaxially grows a metal sulfide on a single crystal silicon substrate by supplying a molecular metal sulfide on the substrate under a reduced pressure, and then epitaxially grows a compound thin film with ionic bonding thereon. A second method epitaxially grows a metal sulfide on a single crystal silicon substrate by supplying a molecular metal sulfide on the substrate under a reduced pressure, and then epitaxially grows two or more compound thin films sequentially with ionic bonding thereon. A third method epitaxially grows a metal sulfide on a single crystal silicon substrate by supplying a molecular manganese sulfide on the substrate under a reduced pressure, and then epitaxially grows aluminum nitride (AlN) with a (11$\bar{2}$0) surface thereon, followed by growing a gallium nitride (GaN) thin film with a (11$\bar{2}$0) surface on the aluminum nitride layer.

A simple metal sulfide whose lattice constant is close to that of Si is ZnS, and their lattice mismatching is about 0.5%. Accordingly, as for a sulfide other than ZnS, which has a large lattice mismatching with Si, it will be considered its crystalline is impaired when grown on the Si substrate, thereby degrading the crystalline of an ionic crystal thin film formed on its sulfide layer in its initial growing step. However, the crystalline of the ionic crystal thin film can be improved by increasing its thickness or by controlling its growing conditions. For example, a lateral overgrowth method is effective which forms a mask of silicon oxide and the like on a substrate crystal with a high dislocation density, and carries out facet formation by starting crystal growth from an opening formed by lithography. Thus, it is necessary for the buffer layer only to determine the orientation of the epitaxial growth of the ionic crystal between the thin film formed thereon and the Si substrate as described in the foregoing embodiment.

Consequently, in spite of a small lattice mismatching with Si, using a buffer layer composed of an epitaxially grown sulfide makes it possible to form an ionic crystal thin film device on the buffer layer by the epitaxial growth.

As described above, according to the present invention, using the sulfide buffer layer makes it easy to form the thin film device by epitaxially growing the ionic bonding crystal on the Si substrate with improving the characteristics. In particular, forming GaN/AlN/MnS/Si (100) thin films enables the commonly used Si substrate to be used to form the GaN (11$\bar{2}$0) surface with the thermodynamically stable wurtzite structure which is free from the Stark effect on its light emitting characteristics, thereby being able to form a highly efficient light emitting device at low cost.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A thin film device comprising: a metal sulfide layer selected from the group consisting of manganese sulfide (MnS), magnesium sulfide (MgS), and calcium sulfide (CaS), which is formed on a single crystal silicon substrate; and a thin film comprising an ionic compound, which is formed on the metal sulfide layer, wherein said single crystal silicon is a single crystal silicon (100), and said ionic compound thin film is an aluminum nitride (AlN) having a (1120) surface as its top surface.

2. The thin film device as claimed in claim 1, further comprising an ionic compound having a (1120) thin film, which has a (1120) surface formed by epitaxial growth as its top surface, and is formed on said aluminum nitride (AlN) layer having the (1120) surface as its top surface, or via another intermediate layer.

3. The thin film device as claimed in claim 2, wherein said compound thin film comprises a gallium nitride (GaN) thin film having a (1120) surface as its top surface.

* * * * *

UNITED STATES PATENT AND TRADEMARK OFFICE
CERTIFICATE OF CORRECTION

PATENT NO. : 7,259,409 B2
APPLICATION NO. : 10/665524
DATED : August 21, 2007
INVENTOR(S) : Hideomi Koinuma et al.

It is certified that error appears in the above-identified patent and that said Letters Patent is hereby corrected as shown below:

On the Title Page

Item (73) Assignee: "Tokyo Institute of Technology, Tokyo (JP)" should read

--National Institute for Materials Science, Tsukuba-shi (JP)

and

Fuji Electric Holdings Co., Ltd., Kawasaki-shi (JP)--

Signed and Sealed this
Twenty-fifth Day of January, 2011

David J. Kappos
*Director of the United States Patent and Trademark Office*